(12) United States Patent
Eustis et al.

(10) Patent No.: US 7,937,632 B2
(45) Date of Patent: May 3, 2011

(54) DESIGN STRUCTURE AND APPARATUS FOR A ROBUST EMBEDDED INTERFACE

(75) Inventors: Steven M. Eustis, Essex Junction, VT (US); Kevin W. Gorman, Fairfax, VT (US); David E. Lackey, Jericho, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 12/144,703

(22) Filed: Jun. 24, 2008

(65) Prior Publication Data
US 2009/0319841 A1    Dec. 24, 2009

(51) Int. Cl.
G11C 29/14    (2006.01)
G11C 29/50    (2006.01)

(52) U.S. Cl. .......................... 714/718; 714/724
(58) Field of Classification Search .......................... None
See application file for complete search history.

(56) References Cited

U.S. PATENT DOCUMENTS

| | | | |
|---|---|---|---|
| 6,026,050 A | 2/2000 | Baker et al. | |
| 6,029,250 A | 2/2000 | Keeth | |
| 6,374,360 B1 | 4/2002 | Keeth et al. | |
| 6,629,277 B1 | 9/2003 | Sanghani | |
| 6,857,084 B1* | 2/2005 | Giles | 714/35 |
| 6,906,968 B2 | 6/2005 | Kim et al. | |
| 6,944,737 B2* | 9/2005 | Ahn et al. | 711/167 |
| 7,274,605 B2 | 9/2007 | Stubbs | |
| 2006/0028259 A1* | 2/2006 | Aksamit | 327/202 |
| 2008/0022149 A1* | 1/2008 | Ouellette et al. | 714/6 |
| 2009/0319818 A1* | 12/2009 | Eustis et al. | 713/501 |

OTHER PUBLICATIONS

NN9308139, Clocking Circuit for Flush L1 Latches in the RISC Single Chip Processor, Publication Date: Aug. 1, 1993, IBM Technical Disclosure Bulletin, US; vol. No. 36, Issue No. 8, Page No. 139-140.*

* cited by examiner

Primary Examiner — Robert Beausoliel
Assistant Examiner — Dipakkumar Gandhi
(74) Attorney, Agent, or Firm — David Cain; Roberts Mlotkowski Safran & Cole, P.C.

(57) ABSTRACT

A design structure is embodied in a machine readable medium for designing, manufacturing, or testing an integrated circuit. The design structure includes an input register coupled to a data processing unit input and a test operation mode and functional operation mode. In the test mode operation, the register operates in a clocked mode such that, during the test operation mode, the register propagates data to the data processing unit in response to a clock signal. In the functional operation mode, the register operates in a data flush mode such that the register propagates data to the data processing unit in response to the data. The functional mode is enabled by a flush enable signal and the test mode is enabled by an opposite state of the flush enable signal.

15 Claims, 6 Drawing Sheets

US 7,937,632 B2

DESIGN STRUCTURE AND APPARATUS FOR A ROBUST EMBEDDED INTERFACE

CROSS REFERENCE TO RELATED APPLICATIONS

The present application is related to co-pending application Ser. No. 12/144,686, filed simultaneously herewith.

FIELD OF THE INVENTION

The invention relates to a design structure and, more particularly to a design structure and apparatus for a robust embedded memory interface.

BACKGROUND

Embedded memory designs are constantly trying to improve performance (reducing memory cycle time or memory access time and/or increasing bandwidth) in order to enable new capabilities for systems on a chip. Many different architectural tradeoffs are made in the pursuit of such improved performance. For example, one tradeoff to enable improved access/cycle time of a memory is to require control/data inputs to the memory to be setup to the memory clock by increasingly larger percentages of the clock cycle time. A different tradeoff to enable improved bandwidth of a memory is to increase the width of the memory data bus. As the width of the data bus increases, though, the clock skew between physically distant data bits can increase. This can lead to larger data setup/hold requirements relative to the clock cycle time.

Another issue that is causing setup/hold times to become a larger requirement relative to a memory's overall cycle/access time is that most input paths relative to the clock travel through relatively standard combinatorial digital gate delays. This can be contrasted with the actual internal data path, which is often of a more complex/analog nature (using sense-amplified signals, domino logic, etc.). Changing the architecture of the internal data path can result in a very large reduction in the memory cycle/access time, whereas little can often be done to change the input signal setup and hold times. The net of all of these issues is that setup/hold requirements for memory inputs is often becoming a larger percentage of the overall cycle time, making these requirements more difficult to satisfy.

At the same time, as technology features decrease, memory designs are becoming much more susceptible to various defect mechanisms that can only be discovered by testing under very specific conditions. Test logic, often BIST (built in self test) and/or BISR (built in self repair) circuitry, must be capable of working correctly under a wide variety of conditions, often far outside the normal customer application ranges for temperature and voltage. This leads to a need for an extremely robust memory interface that allows test circuitry to correctly access the memory under diverse conditions, while at the same time allowing for high performance customer applications with setup/hold times adequately met.

Solutions to the above problems have not adequately addressed both the hold time and setup time issues. For example, FIG. 1a shows a structure, which has a large hold margin and a small setup margin, with RAM_DATA being launched off of the rising edge triggered Flip-Flop when CLK falls. A timing diagram showing the large hold margin and small setup margin of the structure of FIG. 1a is shown in FIG. 1b.

More specifically, as shown in FIGS. 1a and 1b, to provide an interface all data is basically launched to the memory off of the opposite edge of the clock. Note that if the RAM setup/hold requirements are related to the rising edge of the clock, the data would be launched to the RAM off of a negative edge triggered latch. This ensures all hold times are met by providing a half cycle of hold margin as shown in FIG. 1b. If there is a hold issue at a particular frequency the clock cycle can simply be slowed down until there is enough hold margin to access the memory, allowing for correct test capability under diverse conditions, albeit at a lowered frequency. However, this same technique of launching data to the array off of the opposite clock edges also means there is only a half cycle for setup (see FIG. 1b). Memory setup requirements can always be made to pass if the cycle time is decreased, but this can lead to severe performance issues. The setup requirements for the memory can often dictate the overall allowable cycle time.

In comparison, the structure of FIG. 2a provides a large setup margin and a small hold margin. This is shown more specifically in the timing diagram of FIG. 2b. In particular, referring to FIGS. 2a and 2b, in an interface where the data is launched to the memory on the same edge the memory setup/hold requirements are related, hold issues can easily develop under many conditions (particularly under high voltage test corners). A full cycle is available for setup, but nothing can be done to mitigate hold time issues, which can cause severe test failures at even relatively benign test conditions.

Those skilled in logic design will recognize that where positive/negative edge triggered flip-flops have been described above, level sensitive scan design (LSSD) latches could be used (positive edge triggered operation approximated by using the LSSD L2 output and negative edge triggered operation approximated using the LSSD L1 output). Regardless of the exact latching circuitry/clocking methodology chosen, though, the same issues are still encountered.

Accordingly, there exists a need in the art to overcome the deficiencies and limitations described hereinabove.

SUMMARY

In a first aspect of the invention, an apparatus for sampling data into a data processing unit comprises an input register coupled to a data processing unit input and a test operation mode and functional operation mode. In the test mode operation, the register operates in a clocked mode such that, during the test operation mode, the register propagates data to the data processing unit in response to a clock signal. In the functional operation mode, the register operates in a data flush mode such that the register propagates data to the data processing unit in response to the data. The functional mode is enabled by a flush enable signal and the test mode is enabled by an opposite state of the flush enable signal.

In another aspect of the invention, an LSSD design based interface comprises a first flip flop and a second flip flop each having latches L1, L2 and respective inverters and AND gates. The first flip flop and the second flip flop are controlled by control signals LSSD_C and LSSD_B. A FLUSHN control feeds through another AND gate and one of the inverter and AND gates associated with the second flip flop.

In another aspect of the invention, a design structure is embodied in a machine readable medium for designing, manufacturing, or testing an integrated circuit. The design structure includes an input register coupled to a data processing unit input and a test operation mode and functional operation mode. In the test mode operation, the register operates in a clocked mode such that, during the test operation mode, the register propagates data to the data processing unit in response to a clock signal. In the functional operation mode, the register operates in a data flush mode such that the register propagates data to the data processing unit in response to the data. The functional mode is enabled by a flush enable signal and the test mode is enabled by an opposite state of the flush enable signal.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a design structure and, more particularly, to a design structure and apparatus for a robust embedded memory interface. More specifically, the present invention provides an interface between a memory or data processing unit and a unit supplying its data. The interface uses a level sensitive scan design (LSSD) latch configuration to provide the advantages of the present invention. The circuit and methodology discussed herein can form a component of ASIC or microprocessor design methodology for other microelectronic products.

Advantageously, the interface of the present invention can be operated in two different modes to optimize setup and hold times depending on the conditions under which the memory or data processing unit is operating. In one mode, optimized for LSSD-style testing, the data is effectively launched into the memory unit by LSSD_B and LSSD_C clocks. In a second mode, the data is effectively launched into the memory unit by a system clock (CLK). Setup and hold times for the data with respect to whichever clock is used are optimized by a number of clock control gates. In implementation, the LSSD latch is thus controlled in a unique way so as to provide high speed (functional) operation in an edge clock mode with almost (substantially) a full cycle available for setup, while still allowing for a robust test mode used to guarantee hold requirements under all conditions.

The methodology of the present invention can be implemented to determine which memory inputs should use the circuit of the present invention and which inputs should use the more traditional method that provides much less setup margin, but slightly more hold margin (launching data off of the opposite clock edge). The test methodologies can include, for example, mux-scan, in addition to other well known test methodologies.

Figure 1A:
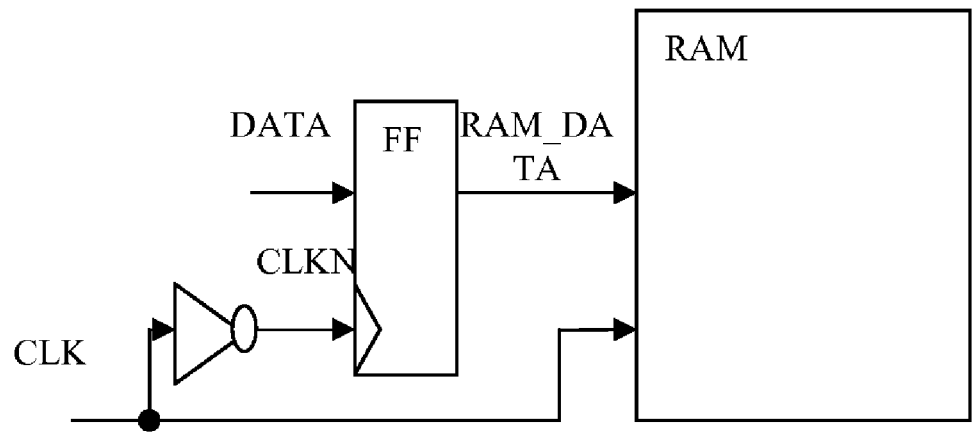
FIG. 1a shows a logic structure having a large hold margin and a small setup margin.
Figure 1B:
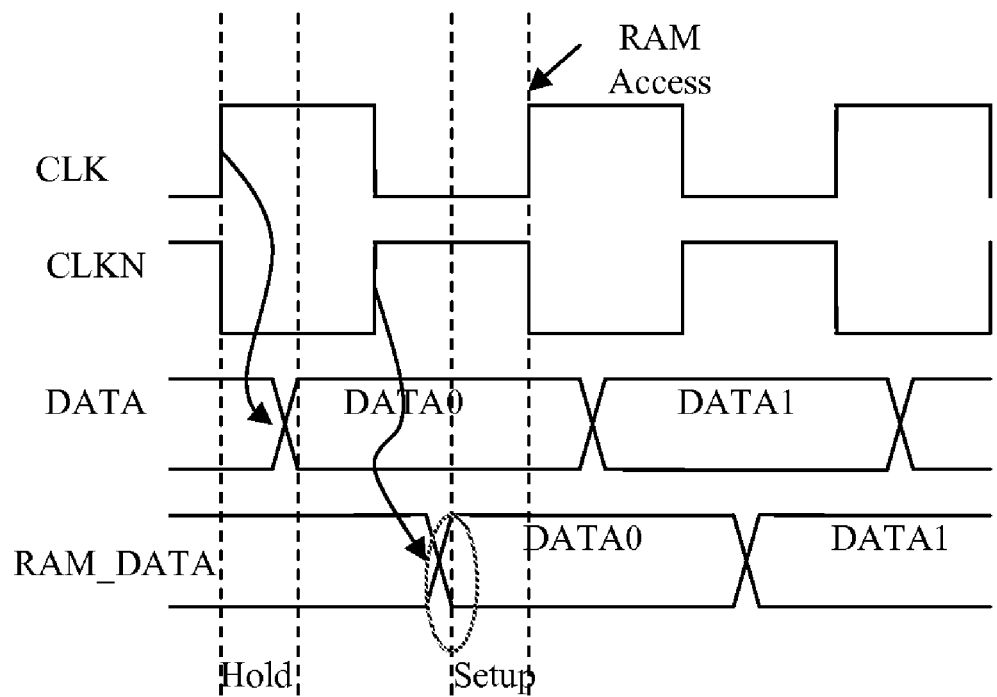
FIG. 1b shows a timing diagram of the structure of FIG. 1.
Figure 2A:
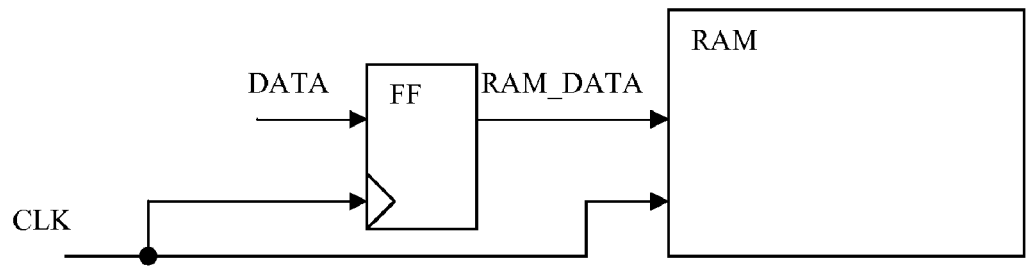
FIG. 2a shows a logic structure having a small hold margin and a large setup margin.
Figure 2B:
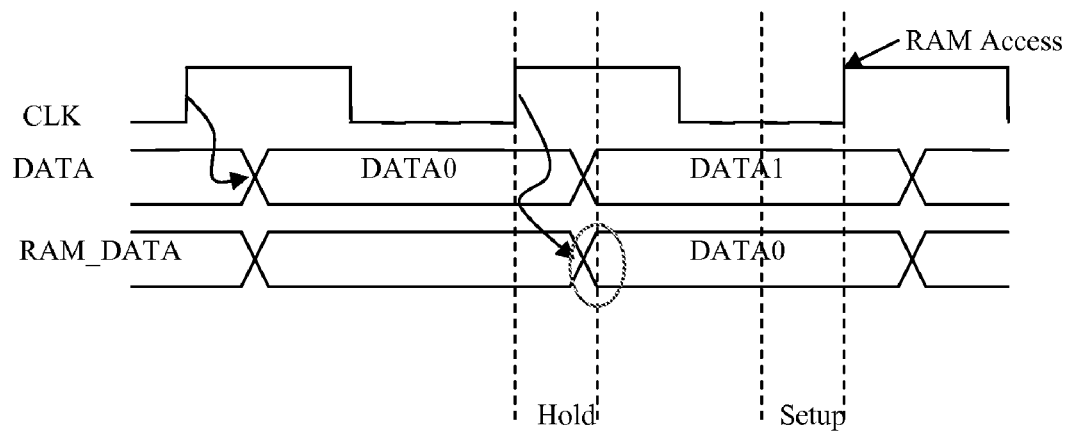
FIG. 2b shows a timing diagram of the structure of FIG. 2.
Figure 3:
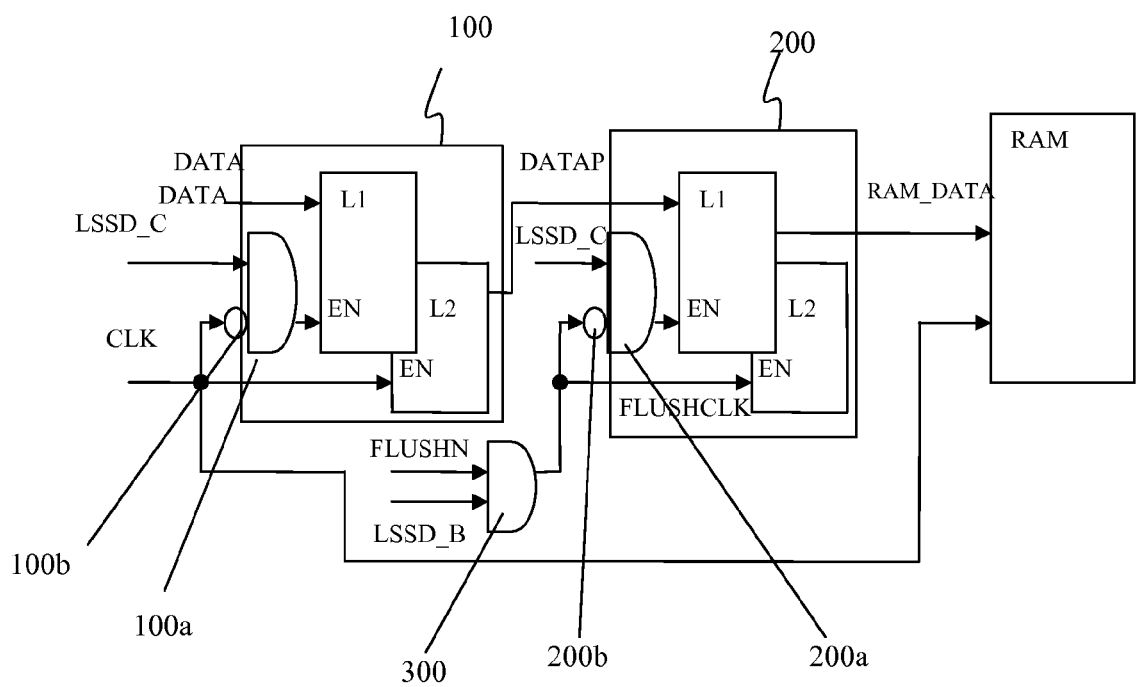
FIG. 3 shows a logic structure in accordance with an aspect of the invention.

The logic structure of the present invention is shown in FIG. 3. More specifically, FIG. 3 shows an LSSD based design having a first flip flop 100 and a second flip flop 200, both having latches L1, L2, respective inverters 100b, 200b, and respective AND gates 100a, 200a. The flip flops 100 and 200 are controlled by control signals LSSD_C and LSSD_B. In embodiments, LSSD_C and LSSD_B are controls used as test mode control signals and, as such, are kept high during functional use. The control signal LSSD_C feeds into the flip flops 100, 200 via the respective AND gates 100a, 200a; whereas, the control signal LSSD_B feeds into the flip flop 200 through AND gate 300 and inverter 200b and AND gate 200a.

A control signal FLUSHN feeds into the latch L1 of the flip flop 200 through AND gate 300 and inverter 200b and AND gate 200a. The control signal FLUSHN also feeds into the latch L2 of the flip flop 200 passing only through AND gate 300. AND gate 300 generates a FLUSHCLK signal from the inputs FLUSHN and LSSD_B. This FLUSHCLK signal feeds into latch L2 of the flip flop 200 and through inverter 200b and AND gate 200a and into latch L1 of the flip flop 200. A clock signal (CLK) feeds directly into L2 latch of flip flop 100, L1 latch of flip flop 100 through inverter 100b and AND gate 100a, as well as drives the RAM. In this way, the invert of the clock signal (CLK) is fed into latch L1 (passing through inverter 100b and AND gate 100a when LSSD_C is high). DATA is fed into the flip flop 100 via latch L1, resulting in an output from latch L2 of DATAP under conditions described herein. DATAP is fed into flip flop 200 via latch L1 and its output is RAM_DATA, under conditions described herein.

As thus shown, the circuit essentially uses an LSSD based edge triggered flip flop (invert/AND gate combo driving the L1 of each latch) and uses the L1 output of one latch L1 to drive the RAM circuit. Advantageously, an addition of logic generates a FLUSHCLK that is used to launch data to the array from the L1 output of the flip flop 200 (LSSD latch).

Figure 4A:
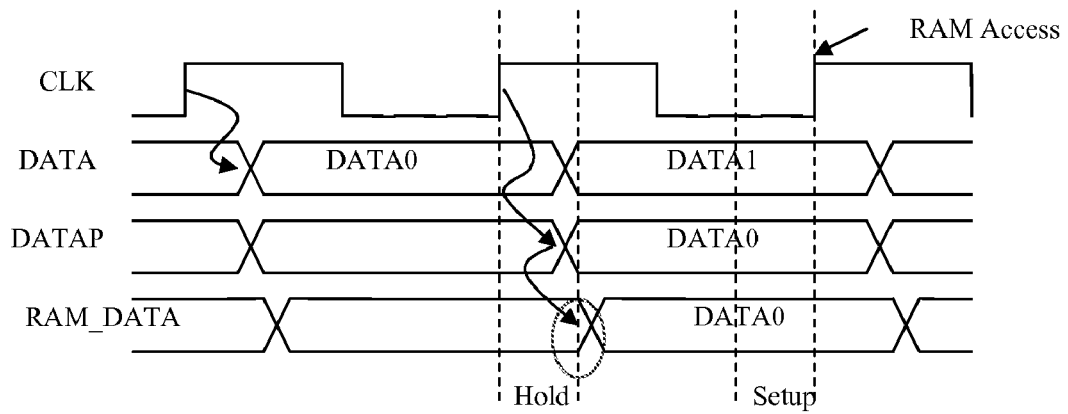
FIGS. 4a and 4b show timing diagrams of the structure of FIG. 3.
Figure 4B:
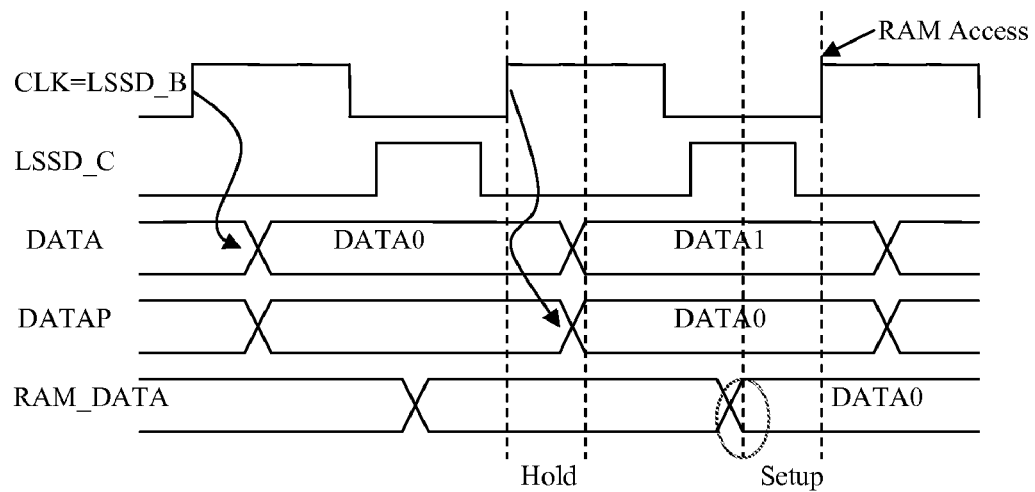

FIGS. 4a and 4b show timing diagrams of the structure of FIG. 3. As shown in FIGS. 4a and 4b, depending on functional mode or test mode, the setup margin or hold margin, respectively, can be adequately met by the circuit of the present invention. For example, FIG. 4a shows a timing diagram for a functional mode and FIG. 4b shows a timing diagram for a test mode. In the functional mode of the circuit, there is no impingement or interference with the setup margin thereby allowing the clock to run at faster speeds. In the test mode, typically run outside of the customer range, e.g., at high voltage or temperature, there is a large hold margin. In the test mode, as the clock frequency is not important, the setup margin can be smaller.

As shown in FIGS. 4a and 4b, during normal edge operation, the L1 output is a slightly delayed version of the input for full cycle access to the RAM, with more built in hold margin due the flush delay through the latch. This flush operation is accomplished by virtue of holding the edge clock input into the L1 portion of the latch to a constant ground via the FLUSHN signal. For more robust operation under diverse test conditions FLUSHN is held to 1, allowing for the LSSD_C input to control when data is launched to the array. This allows for slower, non overlapping LSSD_C and LSSD_B phase clocks to launch data to the array when LSSD_C=1 and then, some time later after the danger of a hold time problem has passed, the RAM is activated when LSSD_B=1.

Edge mode high performance operation occurs when FLUSHN=0, LSSD_C=1, and LSSD_B=1. This forces FLUSHCLK=0 and allows RAM_DATA to follow DATAP with some small delay (where DATAP is set to the value of DATA on the rising edge of CLK). This small delay through flip flop 200 in FIG. 3 improves hold times, while providing nearly (substantially) a full cycle of setup time to the related clock edge.

LSSD mode operation occurs when FLUSHN=1, and CLK=LSSD_B. Since actual launch of data to the array is controlled by the LSSD_C clock (a different clock from what is triggering array access) hold time issues can be minimized. Meeting setup requirements can be more of an issue, but since this would normally only be used for various test corners outside of the normal operating conditions, slower RAM performance (slower RAM clock frequency) is usually acceptable, which allows the setup requirements to be met. In other words, during LSSD mode operation, DATA is transferred to DATAP following a pulse high of LSSD_C and a pulse high of CLK (with CLK acting in a synchronous fashion with LSSD_B). DATAP is then transferred to RAM_DATA following a pulse high of LSSD_C. The RAM is then activated from CLK.

Method in Accordance with Aspect of the Invention

Figure 5:
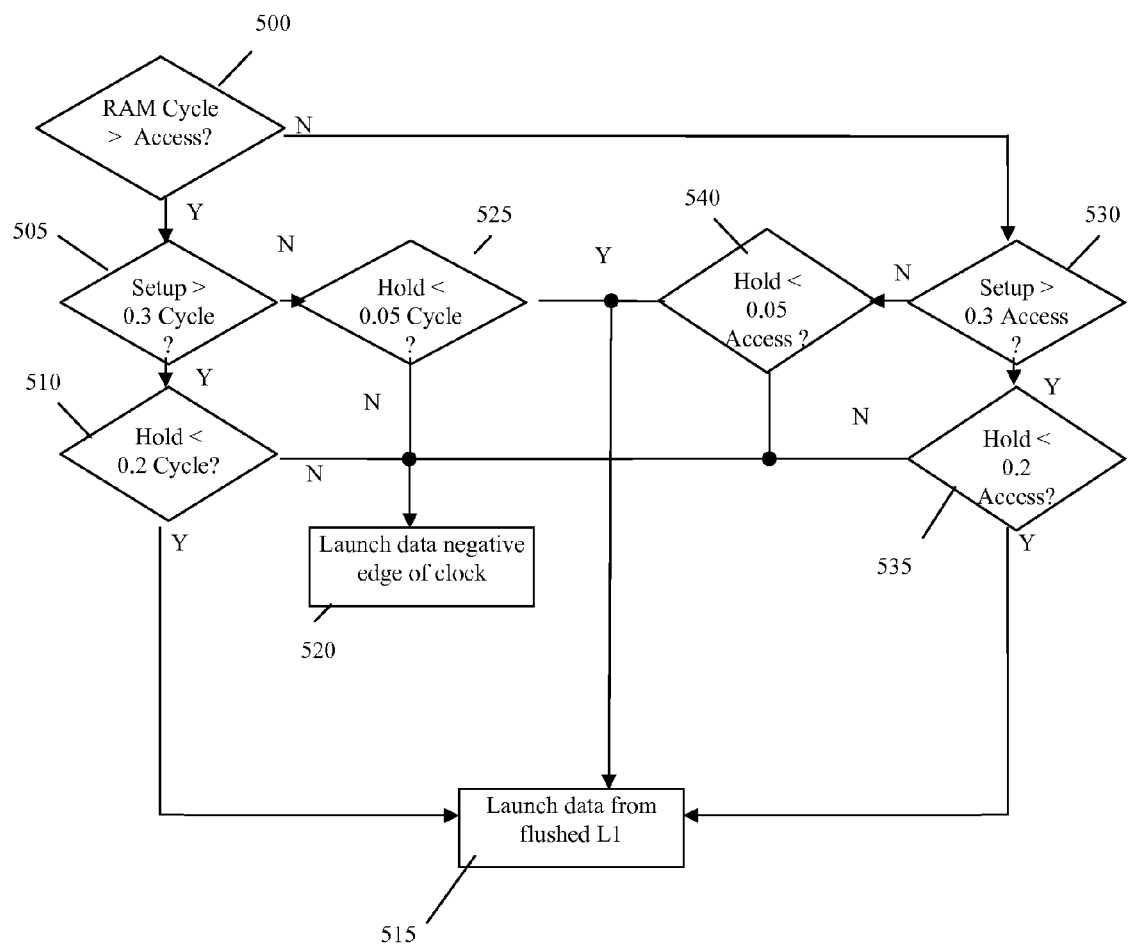
FIG. 5 is a flow diagram implementing logic in accordance with an aspect of the invention.

FIG. 5 is a flow diagram implementing steps of the invention. The invention can take the form of an entirely hardware embodiment, an entirely software embodiment or an embodiment containing both hardware and software elements. The software elements may be firmware, resident software, microcode, etc. Furthermore, the invention can take the form of a computer program product (program control) accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

FIG. 5 shows a flow chart that describes the decision making process for determining which circuitry of the present invention should be implemented. A more traditional method of always launching data to the array with the opposite edge of the clock is very robust for all operations, but can have performance issues. The processes shown in FIG. 5 are thus used to determine exactly when the method of the flushed L1 latch (the method whereby in a functional mode the data propagates directly through the latch for improved setup time but is under clock control in a test mode for improved hold margin) should be implemented, in accordance with the invention. Essentially the flushed L1 method should be used if high setup requirements and reasonably low hold requirements are associated with an input or, alternatively, if very low hold requirements are associated with an input.

More specifically, at step 500, a program control makes a decision as to whether the RAM cycle is greater than the access time for the RAM. If yes, then at step 505, a determination is made as to whether the setup time requirement (for a particular pin relative to the RAM clock) is greater than a predetermined fraction of cycle time such as, for example, 0.3 cycle (three-tenths of the cycle time). If yes, then at step 510, a determination is made as to whether the hold time requirement (for a particular pin relative to the RAM clock) is less than a predetermined fraction of cycle time such as, for example, 0.2 cycle. If yes, the process proceeds to step 515, where the process launches the data from the flushed L1 (i.e., the set up is high and the hold is low). If the hold time is greater than a predetermined fraction of cycle time, the process will proceed to step 520. At step 520, the data is launched from the negative edge of the clock.

If, at step 505, the setup time is lower than the predetermined fraction of cycle time, the process proceeds to step 525. At step 525, a determination is made as to whether the hold time is less than a predetermined fraction of cycle time such as, for example, 0.05 cycles. In embodiments, the fraction of cycle time in step 510 should be greater than the fraction of cycle time in step 525. If the hold requirement is less than the predetermined fraction of cycle time, the process continues to step 520. If the hold time is greater than the predetermined cycle time, the process continues to step 515.

Reverting back to step 500, if the RAM cycle is less than the access time for the RAM, the process continues to step 530. At step 530, a determination is made as to whether the setup time is greater than a predetermined fraction of access time such as, for example, 0.3 access (three tenths of the access time). If the setup time is greater than the specified fraction of access time, the process will continue to step 535. At step 535, a determination is made as to whether the hold time is less than a predetermined fraction of access time such as, for example, 0.2 access. If the hold time is less than the fraction of access time, the process continues to step 515. If the hold time is not less than the fraction of access time, the process continues to step 520.

If the setup time is not greater than the specified fraction of access time at step 530, the process continues to step 540. At step 540, a determination is made as to whether the hold time is less than a predetermined fraction of access time such as, for example, 0.05 access. In embodiments, the fraction of access time of step 540 should be less than the fraction of access time of step 535. If the hold time is less than the fraction of access time at step 540, the process continues to step 515. If the hold time is not less than the fraction of access time at step 540, the process continues to step 525.

Design Structure

Figure 6:
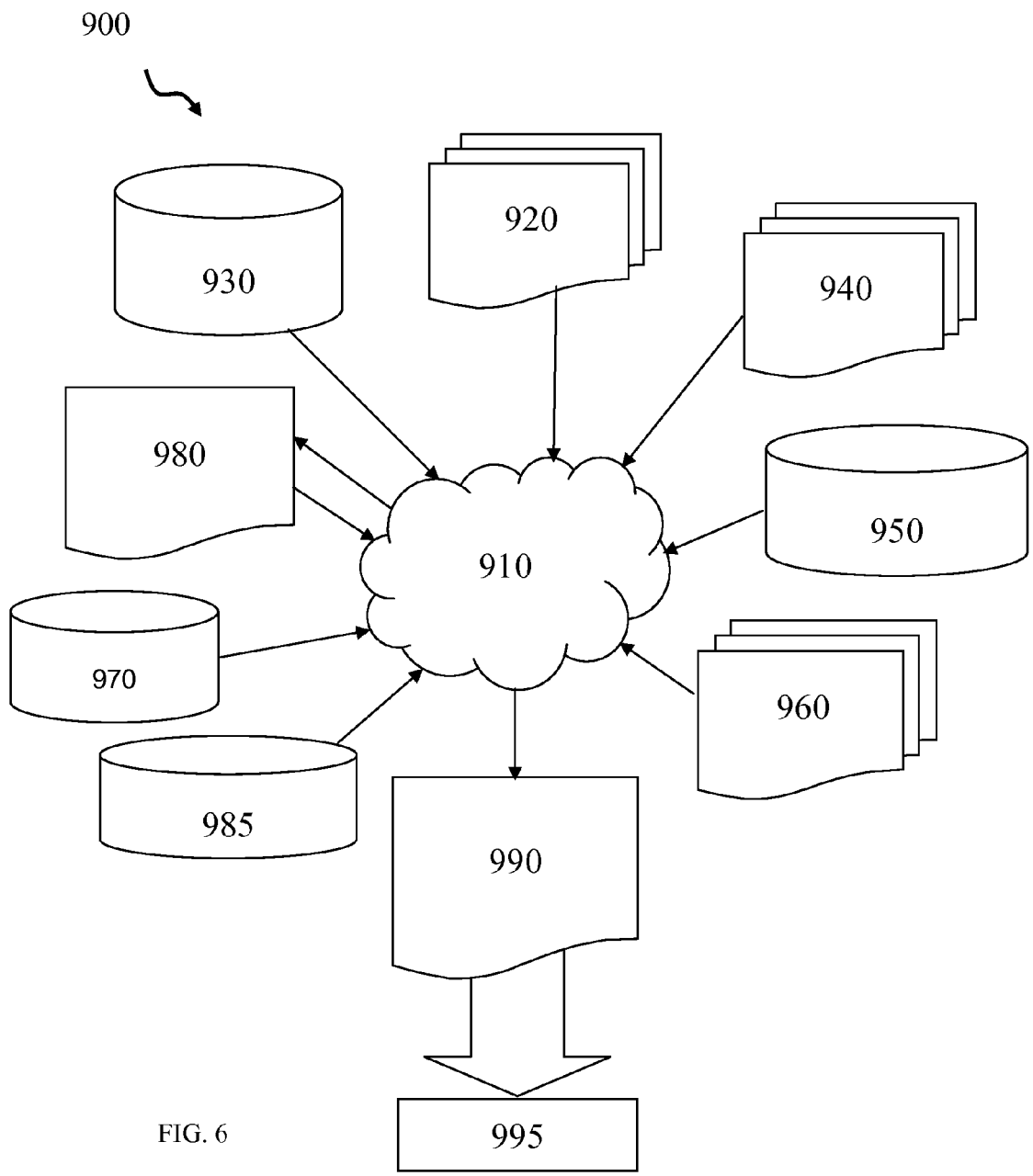
FIG. 6 is a flow diagram of a design process used in semiconductor design, manufacture, and/or test.

FIG. 6 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIG. 3 in the form of schematics or HDL, a hardware-description language (e.g., Verilog, VHDL, C, etc.). Design structure 920 may be contained on one or more machine-readable media. For example, design structure 920 may be a text file or a graphical representation of an embodiment of the invention as shown in FIG. 3. Design process 910 preferably synthesizes (or translates) embodiments of the invention as shown in FIG. 3 into a netlist 980, where netlist 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 3, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIG. 3. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. While the invention has been described in terms of embodiments, those of skill in the art will recognize that the invention can be practiced with modifications and in the spirit and scope of the appended claims.

What is claimed is:

1. An apparatus for sampling data into a data processing unit comprising:
    an input register coupled to a data processing unit input;
    a test operation mode, wherein the register operates in a clocked mode such that, during the test operation mode, the register propagates data to the data processing unit in response to a clock signal; and
    a functional operation mode, wherein the register operates in a data flush mode such that the register propagates data to the data processing unit in response to the data,
    wherein the functional mode is enabled by a flush enable signal and the test mode is enabled by an opposite state of the flush enable signal,
    wherein the clock signal and the flush enable signal are fed through a number of clock control gates.

2. The apparatus of claim 1, wherein the data processing unit is a memory.

3. The apparatus of claim 1, wherein the functional mode is enabled by holding the flush enable signal to a constant ground.

4. The apparatus of claim 3, wherein the test mode is enabled by holding the flush enable signal to 1.

5. The apparatus of claim 4, wherein during the test operation mode, the register propagates data to the data processing unit in response to the clock signal and another clock signal.

6. The apparatus of claim 5, wherein the another clock signal is fed through the number of clock control gates.

7. An LSSD design based interface comprising:
    a first flip flop and a second flip flop each having latches L1, L2, respective inverters and respective AND gates, the first flip flop and the second flip flop being controlled by control signals LSSD_C and LSSD_B; and
    a FLUSHN control signal feeding through another AND gate, and an inverter and one of the AND gates associated with the second flip flop.

8. The interface of claim 7, wherein the LSSD_B control signal is fed through the another AND gate.

9. The interface of claim 8, wherein the another AND gate generates a FLUSHCLK signal from the FLUSHN control signal and the LSSD_B control signal, the FLUSHCLK signal feeding into latch L2 of the second flip flop, and into latch L1 of the second flip flop through the inverter and the AND gate of the second flip flop.

10. The interface of claim 9, wherein the LSSD_C control signal is fed through the respective AND gates of the first flip flop and the second flip flop.

11. The interface of claim 10, wherein a CLK clock signal is fed into latch L2 of the first flip flop, and into latch L1 of the first flip flop through the inverter and the AND gate of the first flip flop.

12. A design structure embodied in a non-transitory machine readable medium for designing, manufacturing, or testing an integrated circuit, the design structure comprising:
    an input register coupled to a data processing unit input;
    a test operation mode, wherein the register operates in a clocked mode such that, during the test operation mode, the register propagates data to the data processing unit in response to a clock signal; and a functional operation mode, whereby the register operates in a data flush mode such that the register propagates data to the data processing unit in response to the data, wherein the functional mode is enabled by a flush enable signal and the test mode is enabled by an opposite state of the flush enable signal, wherein the clock signal and the flush enable signal are fed through a number of clock control gates.

13. The design structure of claim 12, wherein the design structure comprises a netlist.

14. The design structure of claim 12, wherein the design structure resides on storage medium as a data format used for the exchange of layout data of integrated circuits.

15. The design structure of claim 12, wherein the design structure includes at least one of test data, characterization data, verification data, or design specifications.

* * * * *